(12) United States Patent
Bluck et al.

(10) Patent No.: US 6,228,429 B1
(45) Date of Patent: May 8, 2001

(54) METHODS AND APPARATUS FOR PROCESSING INSULATING SUBSTRATES

(75) Inventors: Terry Bluck; James H. Rogers; Jun Xie; Eric C. Lawson, all of Santa Clara, CA (US)

(73) Assignee: Intevac, Inc., Santa Clara, CA (US)

( * ) Notice: Subject to any disclaimer, the term of this patent is extended or adjusted under 35 U.S.C. 154(b) by 0 days.

(21) Appl. No.: 09/495,545

(22) Filed: Feb. 1, 2000

(51) Int. Cl.$^7$ ................................. B05D 1/40; B05D 3/00
(52) U.S. Cl. ............... 427/331; 204/192.32; 204/298.34; 118/503; 118/600; 156/345
(58) Field of Search ........................ 204/192.17, 192.32, 204/298.15, 298.26, 298.34; 427/331; 118/503, 600; 156/345

(56) References Cited

U.S. PATENT DOCUMENTS

| | | | |
|---|---|---|---|
| 5,126,971 | * 6/1992 | Lin et al. ........................ | 365/171 |
| 5,215,420 | 6/1993 | Hughes et al. . | |
| 5,563,095 | * 10/1996 | Frey .................................. | 437/141 |
| 5,721,453 | * 2/1998 | Imai et al. ....................... | 257/700 |
| 5,938,902 | * 8/1999 | Nguyen et al. ................. | 204/298.15 |

* cited by examiner

Primary Examiner—Nam Nguyen
Assistant Examiner—Steven H. VerSteeg
(74) Attorney, Agent, or Firm—Stanley Z. Cole; William McClellan

(57) ABSTRACT

A disk gripper for gripping an insulating disk, such as a glass disk, at its edge during processing includes a contact device for contacting the edge of the insulating disk and a mechanism for moving the contact device between a contact position, in contact with the edge of the disk, and a retracted position. In a first processing station, a conductive coating is applied to a disk held by the gripper, with the contact device in the retracted position. In a second processing station, ions are generated in a plasma adjacent to the surface of the disk held by the gripper. The contact device is in the contact position in contact with the conductive coating, and a bias voltage is applied to the contact device in the second processing station. The ions are accelerated from the plasma toward the disk by the bias voltage applied to the conductive coating.

18 Claims, 7 Drawing Sheets

METHODS AND APPARATUS FOR PROCESSING INSULATING SUBSTRATES

FIELD OF THE INVENTION

This invention relates to methods and apparatus for processing substrates and, more particularly, to methods and apparatus for processing insulating substrates, such as glass substrates for magnetic disks and optical disks.

BACKGROUND OF THE INVENTION

The layers of a typical magnetic disk may include an underlayer of chrome, one or more magnetic layers for information storage and a carbon overcoat. The layers are formed in succession on a suitable substrate. Different layers may be formed in different chambers of a multiple chamber sputter coating system. Sputter coating systems of this type are disclosed, for example, in U.S. Pat. No. 5,215,420 issued Jun. 1, 1993 to Hughes et al and are commercially available from Intevac Inc. of Santa Clara, Calif.

Magnetic disks are conventionally fabricated on metallic substrates. During formation of the layers on the substrate, a bias voltage may be applied to the metallic substrate. Ions within the processing chamber are accelerated toward the substrate by the bias voltage. Depending on the particular process, the acceleration of ions toward the substrate may increase the deposition rate in comparison with an unbiased substrate, may modify the disk surface by ion bombardment, and may produce other desirable effects. In the case of a metallic substrate, the bias voltage may be applied to the substrate through the fingers that physically hold the disk in position for processing.

It has become desirable to use insulating substrates in some applications. For example, glass substrates may be utilized in the fabrication of magnetic disks for laptop computers because of their light weight and durability. However, a problem arises in the processing of glass substrates, because the glass substrate cannot be biased by application of a voltage. Accordingly, the processes utilized with metallic substrates cannot be applied directly to glass substrates. For this reason, processing of glass substrates may be slower than processing of metallic substrates, resulting in higher costs, and the properties of the layers formed on glass substrates may differ from those of the layers formed on metallic substrates.

Accordingly, there is a need for improved methods and apparatus for processing insulating substrates, such as glass substrates.

SUMMARY OF THE INVENTION

According to a first aspect of the invention, a method is provided for processing an insulating substrate, such as a glass disk. The method comprises the steps of gripping an insulating substrate for processing, coating the insulating substrate with a conductive coating, applying a bias voltage to the conductive coating through a contact device which electrically contacts the conductive coating at an edge of the insulating substrate, and generating ions in a plasma adjacent to the surface of the substrate. The ions are accelerated from the plasma toward the substrate surface by the bias voltage applied to the conductive coating. Typically, the conductive coating is applied to the insulating substrate in a first processing station, and the bias voltage is applied to the conductive coating through the contact device in a second processing station.

Where the substrate comprises a disk, the bias voltage may be applied to the conductive coating by tangentially contacting the edge of the disk. The bias voltage may be applied to the substrate with one or more contact pins. The one or more contact pins are movable between a contact position and a retracted position.

According to another aspect of the invention, apparatus is provided for processing an insulating substrate. The apparatus comprises means for gripping an insulating substrate for processing, means for coating the insulating substrate with a conductive coating, means for applying a bias voltage to the conductive coating through a contact device which electrically contacts the conductive coating at an edge of the insulating substrate, and means for generating ions in a plasma adjacent to the substrate surface, wherein the ions are accelerated toward the substrate by the bias voltage applied to the conductive coating.

According to yet another aspect of the invention, apparatus is provided for processing an insulating disk. The apparatus comprises a processing station, a disk gripper located within the processing station for gripping an insulating disk having a conductive coating, the disk gripper including a contact assembly for electrically contacting the conductive coating at an edge of the insulating disk, a voltage source for applying a bias voltage to the conductive coating on the insulating disk through the contact assembly, and a source for generating ions in a plasma adjacent to the disk surface. The ions are accelerated from the plasma toward the disk surface by the bias voltage applied to the conductive coating.

According to still another aspect of the invention, a gripper assembly is provided for gripping a disk during processing. The gripper assembly comprises a gripper housing, a plurality of gripper elements mounted in the housing for gripping the disk at its edge, a contact device mounted in the housing for electrically contacting the edge of the disk, a mechanism for moving the contact device between a contact position and a retracted position, and a conductive path for connecting the contact device to a power supply.

According to a further aspect of the invention, a disk processing system comprises a disk gripper for gripping an insulating disk at its edge during processing, first and second processing stations and a transport device for moving the disk and the disk gripper from the first processing station to the second processing station. The gripper includes a contact device for contacting the edge of the insulating disk and a mechanism for moving the contact device between a contact position in contact with the edge of the disk, and a retracted position. The first processing station applies a conductive coating to a disk held by the gripper, with the contact device in the retracted position. The second processing station generates ions in a plasma adjacent to the surface of the disk held by the gripper, with the contact device in the contact position in contact with the conductive coating and with a bias voltage applied to the contact device. The ions are accelerated from the plasma toward the disk by the bias voltage applied to the conductive coating.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
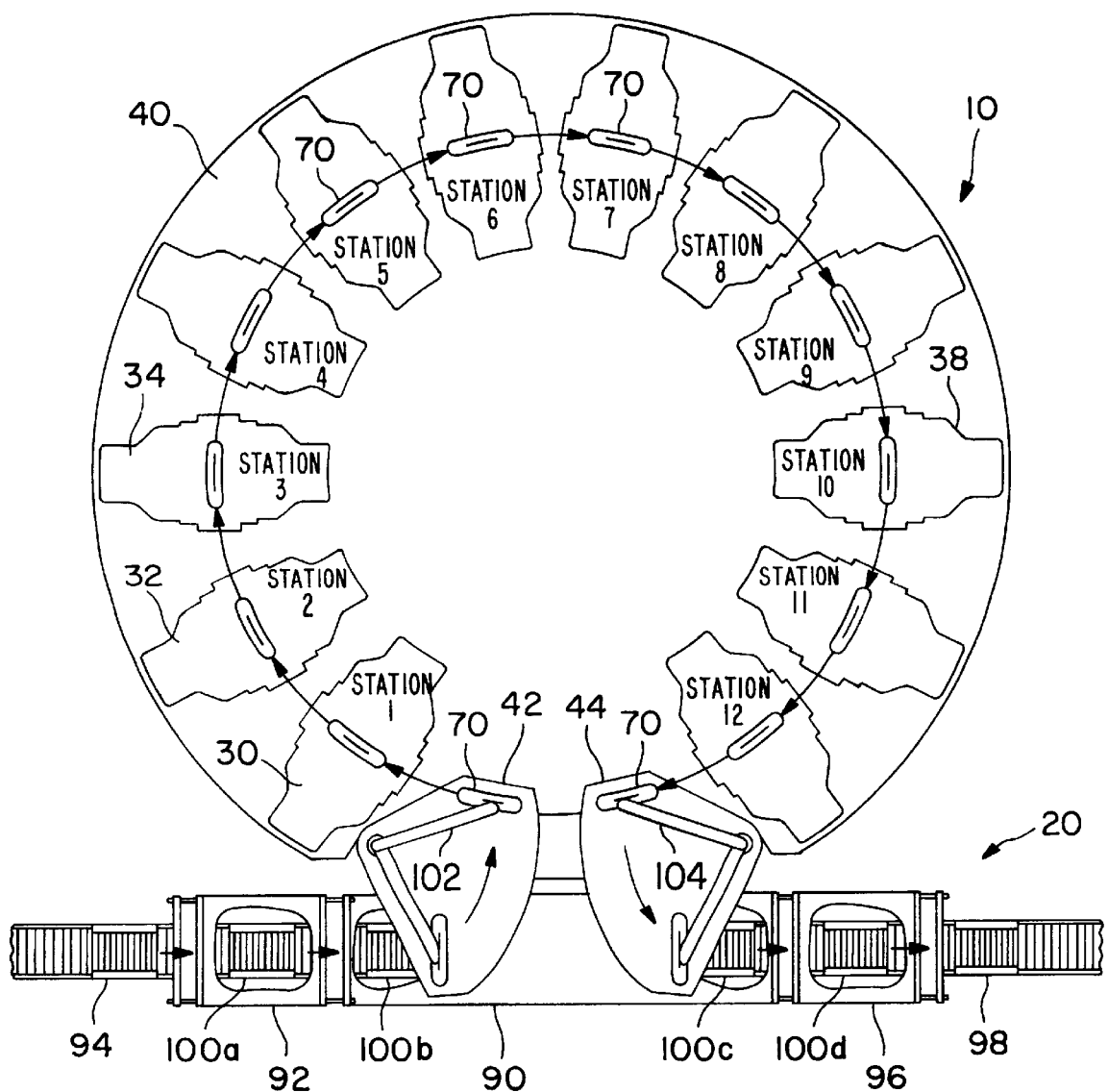
FIG. 1 is a schematic top view of an example of a substrate processing system in accordance with the invention.
Figure 2:
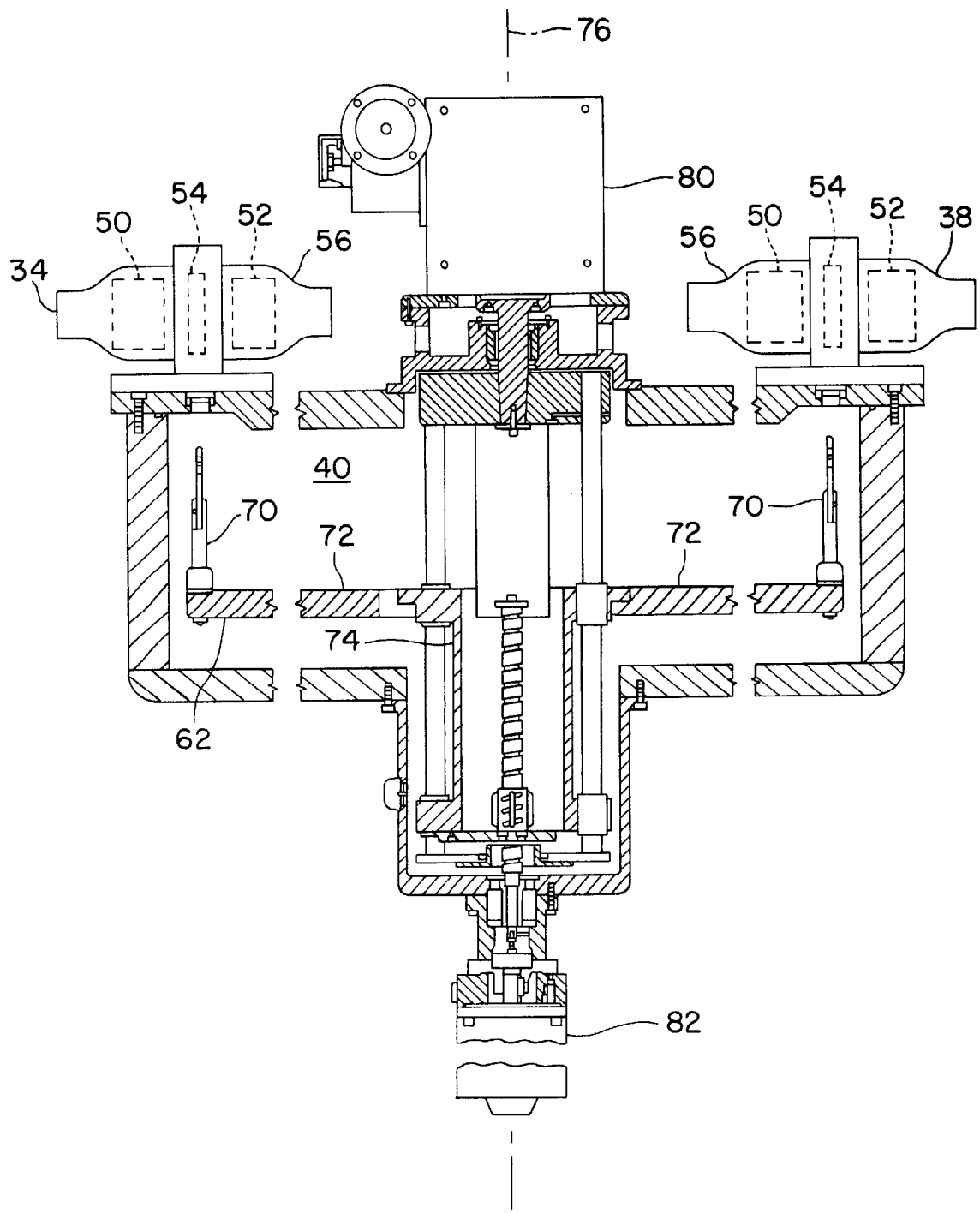
FIG. 2 is a schematic side view, partly in cross section, of the substrate processing system of FIG. 1.

A substrate processing system in accordance with an embodiment of the invention is shown in FIGS. 1 and 2, where like elements have the same reference numerals. The substrate processing system is implemented as a sputter coating system having multiple processing chambers. As shown in FIG. 1, the system includes a processing unit 10 and a substrate handling system 20. Processing unit 10 includes a plurality of processing stations 30, 32, 34, etc. mounted on a main chamber 40. Processing stations 30, 32, 34, etc. are mounted in a circular arrangement with respect to a circular main chamber 40. Processing unit 10 further includes a loading station 42 for loading substrates into the system for processing and an unloading station 44 for unloading substrates from the system following processing. The substrates are typically substrates for magnetic disks or optical disks and include a central opening. The substrate processing system may further include vacuum pumps, power supplies and a controller (not shown).

A cross section of the processing unit 10 through processing station 34 and a processing station 38 is shown in FIG. 2. Processing stations 34 and 38 may each include processing devices 50 and 52 positioned in opposed facing relationship on opposite sides of a substrate processing location 54. Processing devices 50 and 52 and processing location 54 are disposed within a housing 56. Processing devices 50 and 52 may be sputter coating sources, heating devices, or any other desired processing device. The processing devices in the different processing stations 30, 32, 34, etc. may be the same or different, depending on the requirements of the process. In the example of FIG. 1, the system has twelve processing stations, loading station 42 and unloading station 44, which are equiangularly spaced.

A carousel assembly 62 within main chamber 40 includes a plurality of substrate grippers, or disk grippers, 70 in a circular arrangement. The disk grippers 70 are equiangularly spaced and are positioned such that they may be raised into the respective processing stations. The disk grippers 70 are mounted on a carousel 72 which is connected to a central hub 74. Carousel assembly 62 may be rotated about an axis 76 by an indexing motor 80 so that the disk grippers 70 are aligned with respective processing stations 30, 32, 34, etc., the loading station 42 and the unloading station 44. In addition, carousel assembly 62 may be raised and lowered by a drive motor 82 between a lowered position, shown in FIG. 2, and a raised position (not shown in FIG. 2). In the lowered position, the carousel assembly 62 may be rotated about axis 76 into alignment with selected processing stations. In the raised position, the substrates are positioned within the respective processing stations 30, 32, 34, etc. and the loading station 42 and the unloading station 44. The construction and operation of the disk grippers 70 are described in detail below.

Referring again to FIG. 1, substrate handling system 20 includes a buffer chamber 90, a load lock 92, an entrance conveyor 94, and unload lock 96 and an exit conveyor 98. Cassettes 100a, 100b, 100c and 100d carrying substrates for processing enter buffer chamber 90 through load lock 92 and exit from buffer chamber 90 through unload lock 96. A load arm 102 transfers substrates from cassette 100b to disk gripper 70 in loading station 42. An unload arm 104 transfers substrates from disk gripper 70 in unloading station 44 to cassette 100c. Substrate handling system 20 is described in detail in the aforementioned U.S. Pat. No. 5,215,420, which is hereby incorporated by reference.

Figure 3:
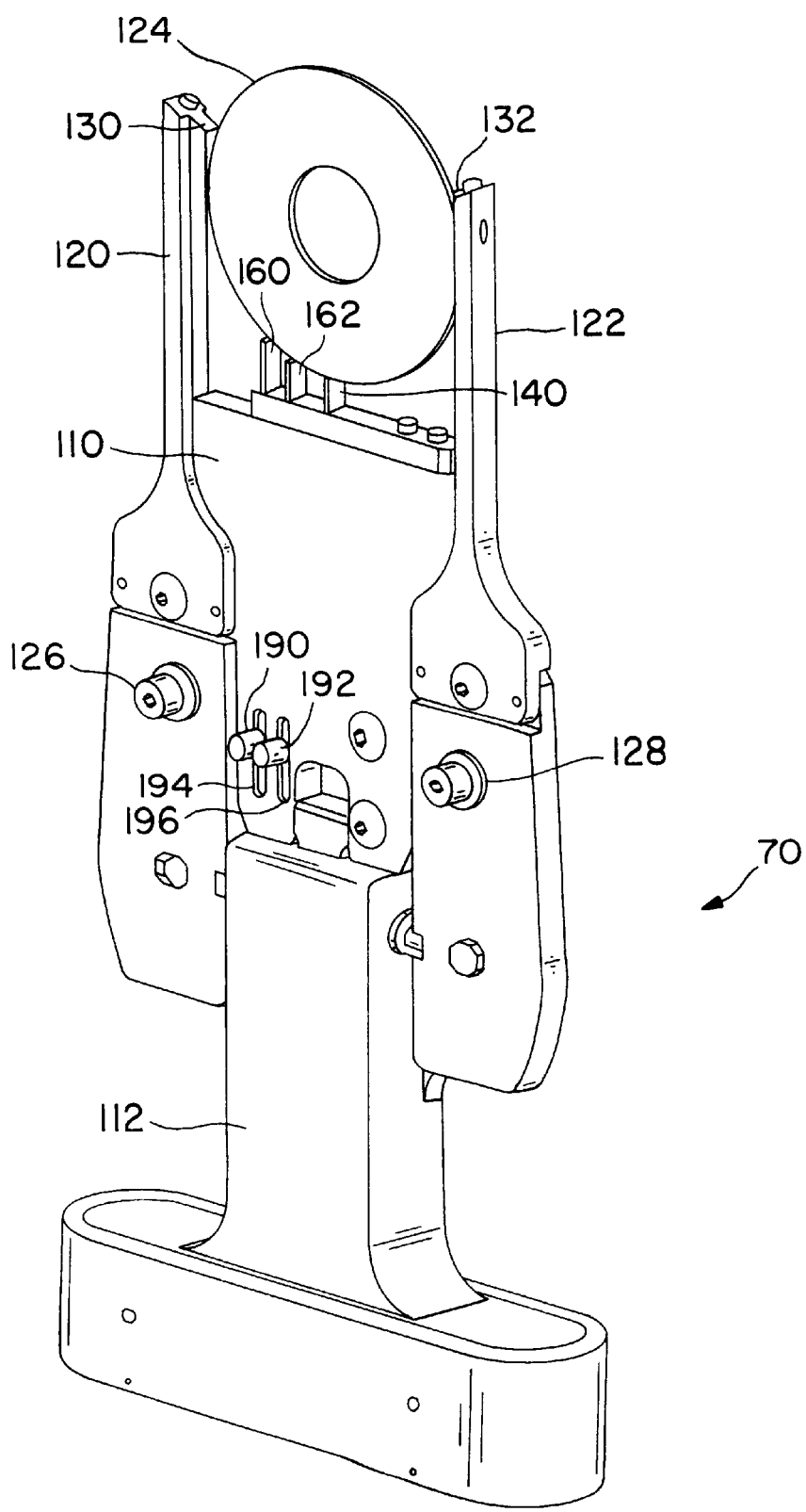
FIG. 3 is a perspective view of a disk gripper in accordance with an embodiment of the invention.
Figure 4:
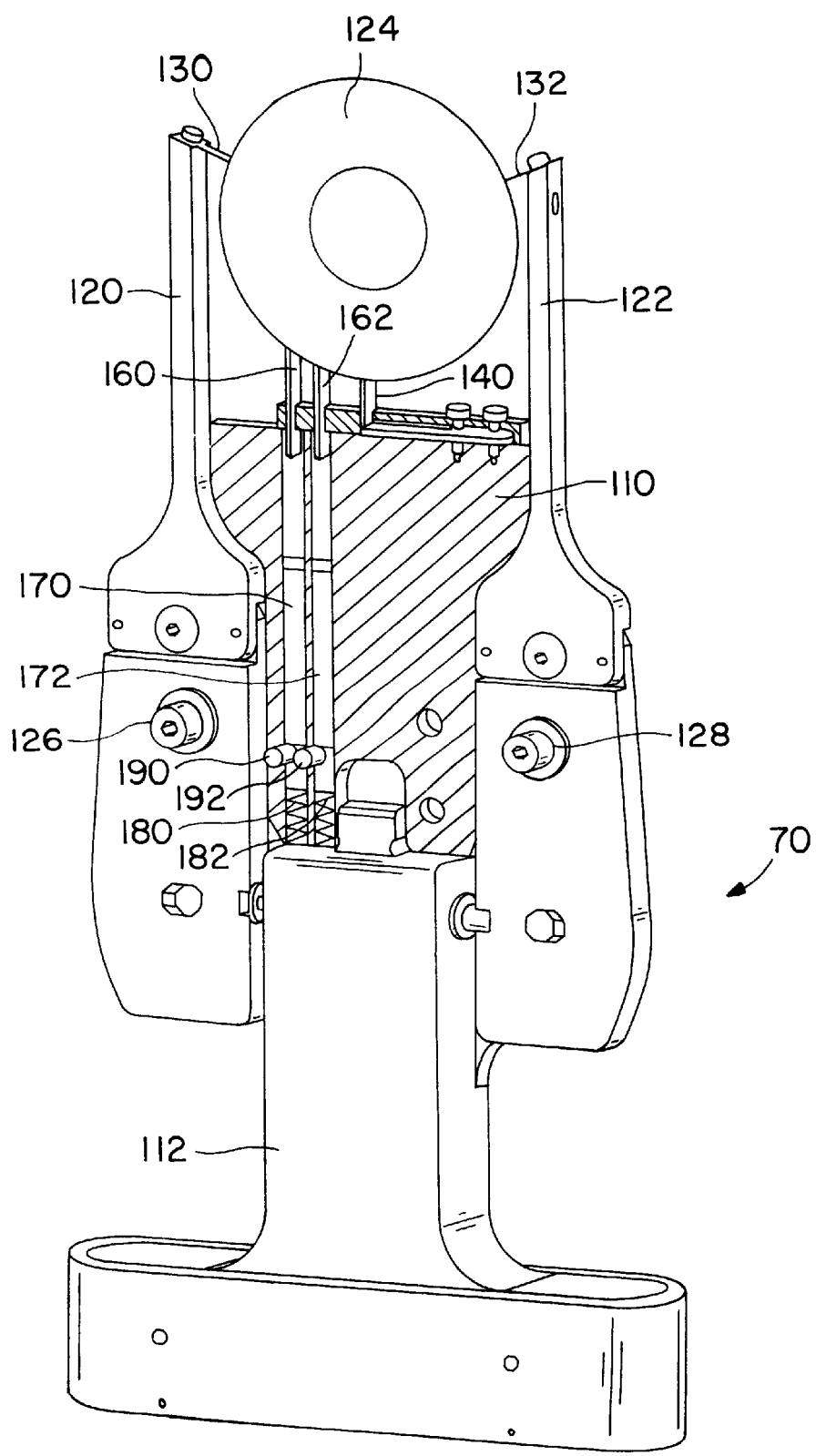
FIG. 4 is a perspective view of the disk gripper of FIG. 3, partly in cross section to illustrate the contact pin assemblies.

A disk gripper with retractable contact pins in accordance with a first embodiment of the invention is shown in FIGS. 3 and 4. Like elements in FIGS. 3 and 4 have the same reference numerals. Disk gripper 70 includes a gripper body 110 supported by a pedestal 112. Pedestal 112 is mounted to carousel 72 (see FIG. 2). Side wings 120 and 122 pivot outwardly about pivot pins 126 and 128, respectively, relative to gripper body 110 for loading and unloading a disk substrate 124. Gripper fingers 130 and 132 are mounted at the ends of side wings 120 and 122, respectively, for physically contacting the edge of disk substrate 124. A gripper finger 140 is mounted below substrate 124 in gripper body 110. Preferably, gripper fingers 130, 132 and 140 are spaced by 120° around the periphery of disk substrate 124.

The disk substrate 124 is transferred to disk gripper 70 by substrate handling system 20 in loading station 42 (see FIG. 1). The disk substrate 124 then remains mounted in disk gripper 70 through all processing in the substrate processing system 10, until it is removed from disk gripper 70 at the unloading station 44. In particular, disk grippers having substrates mounted thereon are transported by the carousel assembly 62 to the desired processing stations 30, 32, 34, etc. for processing. By way of example, substrate 124 may be heated in a first processing station, may have a chrome underlayer formed in a second processing station, may have one or more magnetic layers formed in additional processing stations and may have a carbon overcoat layer formed in a further processing station of processing system 10.

Referring again to FIGS. 3 and 4, disk gripper 70 further includes contact pins 160 and 162 movably mounted in gripper body 110. Contact pins 160 and 162 are rigidly connected to contact rods 170 and 172, respectively. Contact rods 170 and 172 are axially movable in tubular bores or sleeves in gripper body 110. Contact rods 170 and 172 are biased upwardly into contact with substrate 124 by springs 180 and 182, respectively, at the lower ends of contact rods 170 and 172. Retraction pins 190 and 192 extend laterally from contact rods 170 and 172, respectively, through elongated openings 194 and 196 in gripper body 110. Contact pins 160 and 162 are normally biased upwardly into contact with the edge of substrate 124 by springs 180 and 182, as shown in FIG. 3. Contact pins 160 and 162 may be retracted from contact with substrate 124 by applying a downward force on retraction pins 190 and 192. Thus, contact pins 160 and 162 are movable between a contact position shown in FIG. 4 and a retracted position.

Contact pin 160, contact rod 170, spring 180 and retraction pin 190 constitute a first contact pin assembly; contact pin 162, contact rod 172, spring 182 and retraction pin 192 constitute a second contact pin assembly. Contact pins 160 and 162 are independently retractable.

Contact pins 160 and 162 are utilized for applying a bias voltage to substrate 124 at selected stages of processing, as described below. In stations where biasing of substrate 124 is required, contact pins 160 and 162 contact the substrate and are connected to a bias power supply. In processing stations where biasing of substrate 124 is not required, contact pins 160 and 162 are retracted from contact with substrate 124.

In the embodiment of FIGS. 3 and 4, contact pins 160 and 162 have flat tips which tangentially contact the edge of substrate 124. Contact pins 160 and 162 may have flat tips, V-shaped tips or any other shape which provides a reliable electrical contact to substrate 124.

In the embodiment of FIGS. 3 and 4, two contact pins 160 and 162 are utilized to provide redundant and reliable electrical contact. It will be understood that contact pins 160 and 162 are independently biased into contact positions by springs 180 and 182, respectively. Thus, if one of the contact pin assemblies sticks or is broken, the other is likely to operate properly. It will be understood that a single contact pin or more than two contact pins may be utilized within the scope of the present invention.

Figure 5:
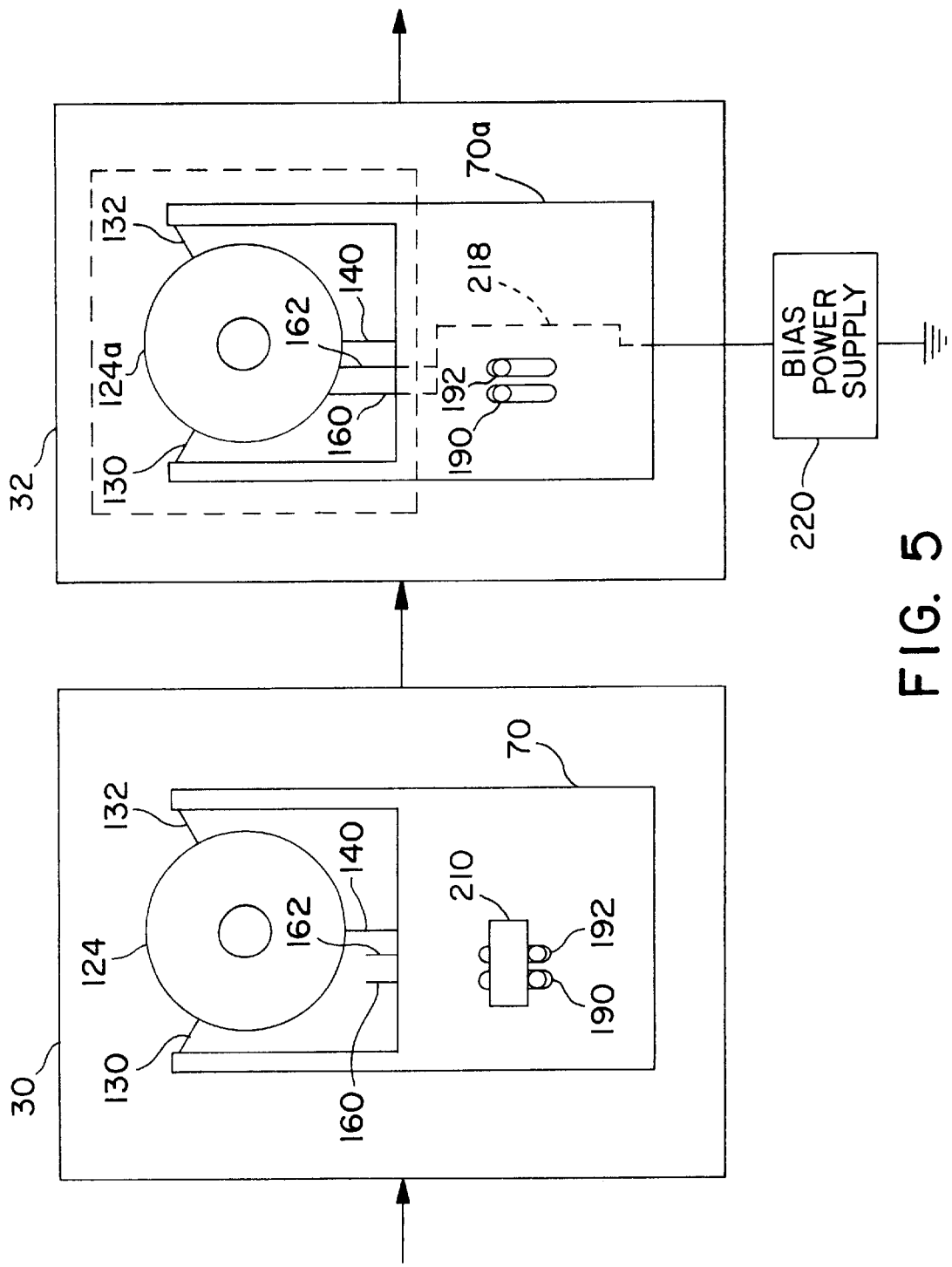
FIG. 5 is a simplified partial block diagram of the processing system, illustrating operation of the retractable contact pins.

An example of the operation of the disk gripper with retractable contact pins is illustrated in FIG. 5. Processing stations 30 and 32 are illustrated. Processing station 30 contains disk gripper 70 carrying substrate 124, and processing station 32 contains disk gripper 70a carrying substrate 124a. It is assumed that processing station 30 is utilized for forming a chrome underlayer on substrate 124 and that processing station 32 is used for forming a magnetic layer on substrate 124a. Processing station 30 includes a retraction block 210 that is positioned to engage retraction pins 190 and 192 as disk gripper 70 is raised into processing station 30 by carousel assembly 62 (see FIG. 2). Block 210 is fixed in position and causes contact pins 160 and 162 to be retracted relative to substrate 124 as disk gripper 70 is raised into the processing position. Thus, contact pins 160 and 162 remain in the retracted position, shown in processing station 30, during formation of the conductive chrome underlayer on substrate 124.

Following formation of the chrome underlayer in processing station 30, disk gripper 70 and substrate 124 are moved to processing station 32, as represented by disk gripper 70a and substrate 124a. Processing station includes an ion source such as processing device 50 and 52 shown in FIG. 2, on each side of substrate 124a. Each ion source generates ions in a plasma adjacent to the surface of substrate 124a. Processing station 32 does not include a retraction block as in the case of processing station 30. Accordingly, springs 180 and 182 bias contact pins 160 and 162 into the contact position, shown in processing station 32, in contact with the edge of disk 124a. Contact pins 160 and 162 are electrically connected, via a conductive path 218, to a bias power supply 220. Bias power supply 220 applies a bias voltage to the conductive coating on substrate 124a through contact pins 160 and 162. The bias voltage applied to the conductive coating accelerates ions from the plasma generated by each ion source toward substrate 124a. The current produced by the incidence of ions on the conductive coating passes through contact pins 160 and 162, contact rods 170 and 172 and bias power supply 220 to ground. The bias voltage is typically in a range of about 100–300 volts, but is not limited to this range. The acceleration of ions toward substrate 124a promotes formation of the magnetic layer and may produce other desirable effects on the substrate surface. The bias voltage may be applied to the substrate in any of the processing stations where such bias voltage is advantageous. Although processing stations 30 and 32 are shown in FIG. 1 as the first two processing stations in the system, it will be understood that the processing stations shown in FIG. 5 and described above may be any two processing stations in the processing system and are not necessarily adjacent to each other.

Figure 6:
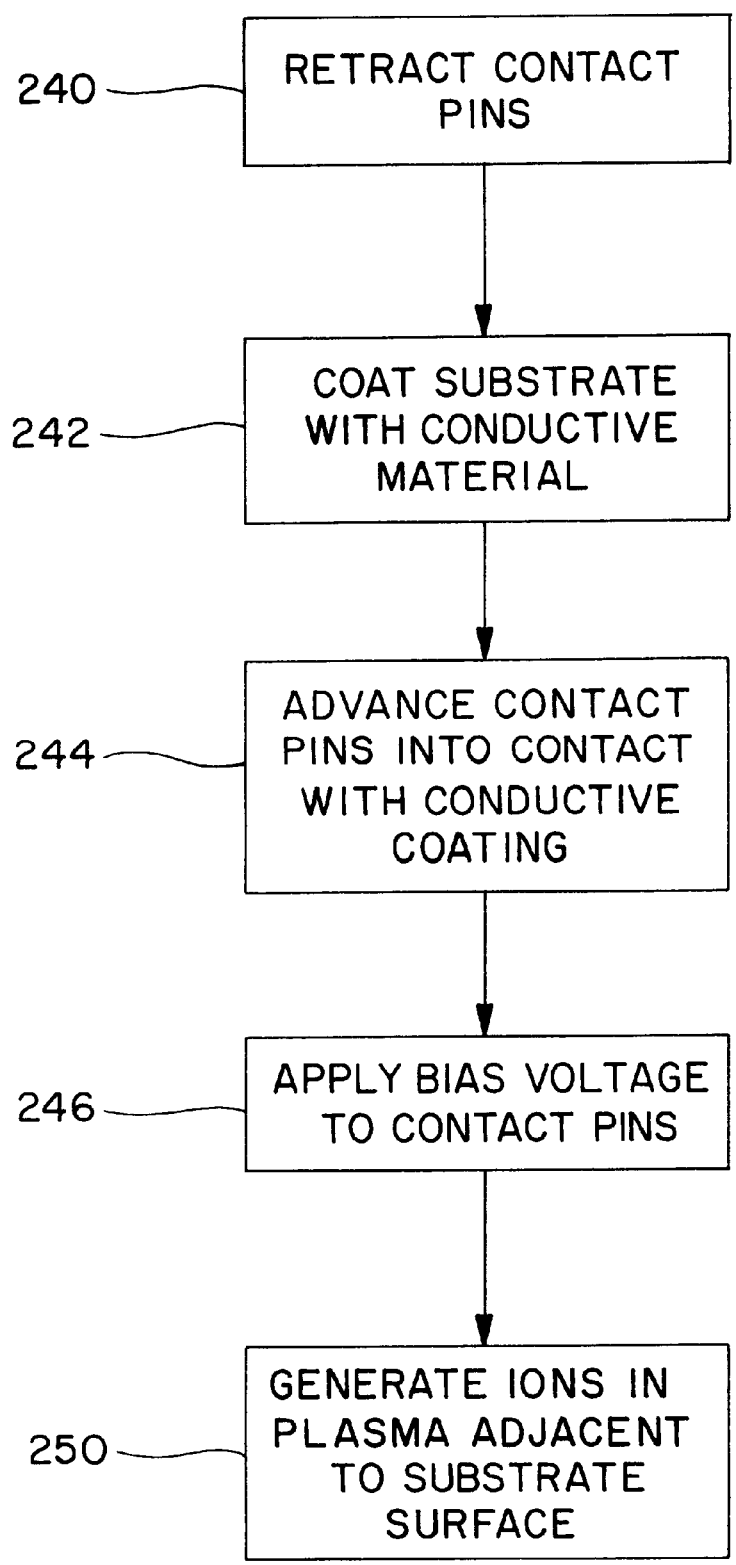
FIG. 6 is a flow chart that illustrates operation of the processing system of FIG. 5.

The process of FIG. 6 is summarized in the flow chart of FIG. 6. In step 240, contact pins 160 and 162 are retracted by retraction block 210 in processing station 30. In step 242, substrate 124 is coated with a conductive material, such as chrome, in processing station 30, with contact pins 160 and 162 retracted. Next, the disk gripper 70 and the substrate 124 are typically moved to a second processing station for formation of a subsequent layer. However, it will be understood that under appropriate circumstances, the subsequent layer may be formed in the same processing station. In either case, contact pins 160 and 162 are advanced into contact with the conductive coating which was formed on the substrate in step 244. In step 246, a bias voltage is applied to the conductive coating on the substrate through contact pins 160 and 162. In step 250, ions are generated in a plasma adjacent to the surface of substrate 124. The ions are accelerated from the plasma to the surface by the bias voltage and enhance the rate of film formation. The ions are present as part of the sputtering process. As indicated above, the bias voltage may be applied to the conductive coating on the glass substrate in any processing station where such bias voltage is advantageous with respect to the process. As further indicated above, the process of FIG. 6 may be carried out in any two processing stations in the processing system, or, alternatively, in any one processing station in the processing system.

Figure 7:
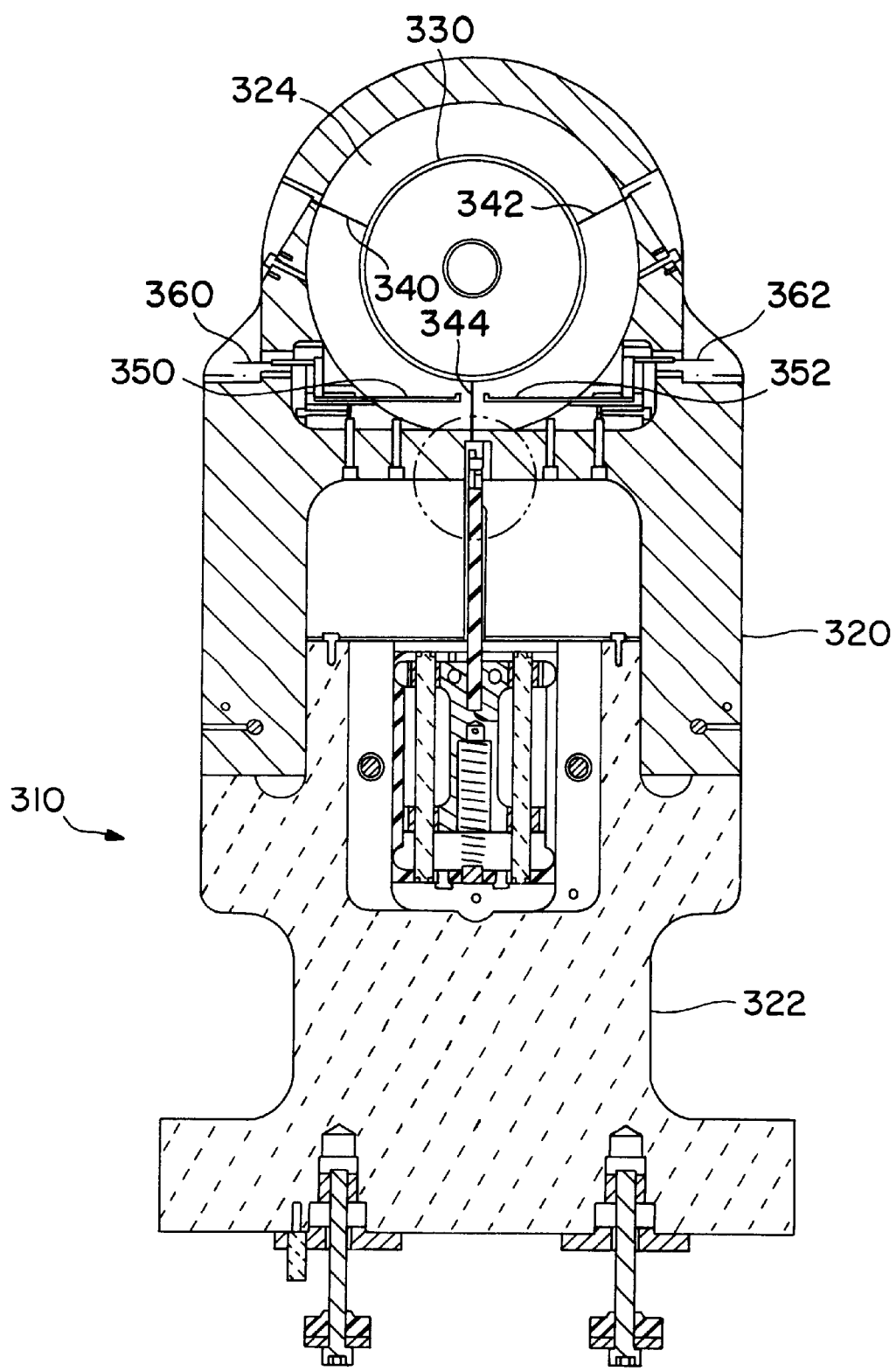
FIG. 7 is a front view of a second embodiment of a disk gripper in accordance with the invention.

A second embodiment of a disk gripper in accordance with the present invention is shown in FIG. 7. A disk gripper 310 includes a gripper body 320 supported by a pedestal 322. In the embodiment of FIG. 7, gripper body 320 has a circular opening 324 for a substrate 330. Gripper fingers 340, 342 and 344 are mounted to gripper body 320 and support substrate 330 at three points spaced apart by 120°. Gripper finger 344 is retracted for loading and unloading of substrate 330.

Gripper assembly 310 further includes contact pins 350 and 352 in the form of leaf springs. The leaf spring contact pins 350 and 352 are mounted for pivoting movement between contact positions in contact with the edge of substrate 330 and retracted positions where they do not contact substrate 330. Contact pins 350 and 352 are coupled to retraction pins 360 and 362, respectively. The retraction pins 360 and 362 engage elements in the processing stations for establishing the positions of contact pins 350 and 352 in the respective processing stations.

Substrate 330 may be coated with a conductive coating in a first processing station with contact pins 350 and 352 retracted. Disk gripper 310 carrying substrate 330 is then moved to a second processing station, and contact pins 350 and 352 are actuated into contact with the edge of substrate 330. A bias voltage is applied to substrate 330 in the second processing station, and ions are accelerated toward the substrate surface.

The present invention thus provides methods and apparatus for reliably biasing an insulating substrate having a conductive coating during formation of subsequent layers. The invention may be utilized in the processing of glass substrates for magnetic disks and optical disks, but is not limited to such use.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A method for processing an insulating substrate, comprising the steps of:
    gripping an insulating substrate for processing;
    coating the insulating substrate with a conductive coating;
    thereafter contacting the conductive coating through a contact device which electrically contacts the conductive coating at an edge of the insulating substrate, said contact device being electrically independent of the structure used for gripping the insulating substrate;
    applying a bias voltage to said conductive coating through said contact device; and
    generating ions in a plasma adjacent to the substrate surface, wherein the ions are accelerated from the plasma toward the substrate surface by the bias voltage applied to the conductive coating.

2. A method as defined in claim 1 wherein the substrate comprises a disk and wherein the step of applying a bias voltage comprises tangentially contacting the edge of the disk.

3. A method as defined in claim 1 wherein the step of applying a bias voltage through a contact device comprises contacting the conductive coating with one or more contact pins.

4. A method as defined in claim 1 wherein the step of applying a bias voltage comprises spring loading the contact device toward the insulating substrate.

5. A method as defined in claim 1 wherein the step of coating the insulating substrate comprises coating a glass disk.

6. A method for processing an insulating substrate, comprising the steps of:
    gripping an insulating substrate for processing;
    coating the insulating substrate with a conductive coating;
    applying a bias voltage to the conductive coating through a contact device which electrically contacts the conductive coating at an edge of the insulating substrate;
    generating ions in a plasma adjacent to the substrate surface, wherein the ions are accelerated from the plasma toward the substrate surface by the bias voltage applied to the conductive coating; and
    retracting the contact device from contact with the insulating substrate during the step of coating the insulating substrate with the conductive coating.

7. Apparatus for processing an insulating substrate, comprising:
    gripping elements for holding an insulating substrate for processing;
    a deposition stage for depositing on the insulating substrate a conductive coating;
    a contact device which operates electrically independently of said grippers and is caused to electrically contact the conductive coating at an edge of the insulating substrate after the insulating substrate has been coated with a conductive coating at said deposition stage; and
    an electrical source to generate ions in a plasma adjacent to the substrate surface, wherein the ions are accelerated from the plasma toward the substrate surface by a bias voltage applied to the conductive coating on the insulating substrate after the conductive coating is coated on the insulating substrate at said deposition stage.

8. Apparatus as defined in claim 7 wherein the substrate comprises a disk with a central circular opening and wherein said contact device is configured for tangentially contacting the edge of the insulating disk.

9. Apparatus as defined in claim 7 further comprising a spring assembly coupled to said contact device.

10. Apparatus as defined in claim 7 wherein said contact device comprises two or more independently movable contact pins.

11. Apparatus for processing an insulating disk, comprising:
    a processing station within a vacuum chamber;
    a disk gripper located within said processing station for gripping an insulating disk configured with a central circular opening;
    deposition means at said station to coat a disk in said disk gripper with a conductive coating, said disk gripper further comprising a contact assembly for electrically contacting the conductive coating at an edge of the insulating disk independently of contacts by said gripper, after coating said disk with said deposition means;
    a voltage source for applying a bias voltage to the conductive coating on the insulating disk through the contact assembly; and
    a source for generating ions in a plasma adjacent to the disk surface, wherein the ions are accelerated from the plasma toward the disk surface by the bias voltage applied to the conductive coating.

12. Apparatus as defined in claim 11 wherein said contact assembly comprises a contact device and a mechanism for moving said contact device between a contact position, in contact with the conductive coating, and a retracted position and means to maintain said contact device in a retracted position during that period while said deposition means at said station is coating said disk and to move said contact device into contact with the conductive coating following deposition of a conductive coating on said disk.

13. Apparatus as defined in claim 11 wherein said contact assembly comprises a contact pin, a contact rod engaging said contact pin, a spring biasing said contact pin into contact with the conductive coating on the insulating disk and a retraction pin for moving said contact pin between a contact position and a retracted position.

14. Apparatus as defined in claim 11 wherein said contact assembly comprises a first contact pin for contacting the conductive coating, a first mechanism for moving said first contact pin between a contact position and a retracted position, a second contact pin for contacting the conductive coating, and a second mechanism for moving said second contact pin between a contact position and a retracted position.

15. A disk processing system comprising:
    a disk gripper for gripping an insulating disk at its edge during processing, said gripper including a contact device which operates mechanically independently of said gripper and is caused to independently electrically contact the conductive coating at an edge of the insulating disk after a conductive coating is deposited onto the insulating substrate and a mechanism for moving said contact device between a contact position, in contact with the disk, and a retracted position;
    a first processing station for applying a conductive coating to a disk held by said gripper with said contact device in the retracted position;

a second processing station for generating ions in a plasma adjacent to the surface of the disk held by said gripper with said contact device in the contact position in contact with the conductive coating and with a bias voltage applied to said contact device, wherein the ions are accelerated from the plasma toward the disk by the bias voltage applied to the conductive coating; and a transport device for moving the disk and said disk gripper from said first processing station to said second processing station.

16. A disk processing system as defined in claim 15 wherein said mechanism comprises a spring for biasing said contact device into the contact position and a retraction pin for moving said contact device to the retracted position.

17. A disk processing system as defined in claim 16 wherein said first processing station comprises a retraction element for engaging said retraction pin and moving said contact device to the retracted position.

18. A disk processing system as defined in claim 17 wherein said second processing station comprises a bias power supply for applying said bias voltage to said contact device.

* * * * *